United States Patent
Pasqualetto

(10) Patent No.: US 10,479,402 B2
(45) Date of Patent: Nov. 19, 2019

(54) METHOD FOR SUPPLYING AN INDUCTIVE LOAD

(71) Applicants: Continental Automotive France, Toulouse (FR); Continental Automotive GmbH, Hannover (DE)

(72) Inventor: Angelo Pasqualetto, Toulouse (FR)

(73) Assignees: Continental Automotive France, Toulouse (FR); Continental Automotive GmbH, Hannover (DE)

(*) Notice: Subject to any disclaimer, the term of this patent is extended or adjusted under 35 U.S.C. 154(b) by 0 days.

(21) Appl. No.: 16/330,190

(22) PCT Filed: Sep. 11, 2017

(86) PCT No.: PCT/FR2017/052399
§ 371 (c)(1),
(2) Date: Mar. 4, 2019

(87) PCT Pub. No.: WO2018/050991
PCT Pub. Date: Mar. 22, 2018

(65) Prior Publication Data
US 2019/0225259 A1 Jul. 25, 2019

(30) Foreign Application Priority Data
Sep. 14, 2016 (FR) .................. 16 58578

(51) Int. Cl.
*H02P 8/36* (2006.01)
*B62D 5/04* (2006.01)
(Continued)

(52) U.S. Cl.
CPC ......... *B62D 5/0487* (2013.01); *G01R 31/343* (2013.01); *H01H 71/12* (2013.01); *H02P 7/04* (2016.02); *H02P 8/36* (2013.01)

(58) Field of Classification Search
USPC ................... 318/280, 287, 291, 293, 294
See application file for complete search history.

(56) References Cited

U.S. PATENT DOCUMENTS

| | | | | |
|---|---|---|---|---|
| 4,494,181 A | * | 1/1985 | Ramlohr | H02P 7/04 318/280 |
| 4,978,898 A | * | 12/1990 | Tsukahara | H02H 7/0838 318/280 |

(Continued)

FOREIGN PATENT DOCUMENTS

| EP | 0800979 A2 | 10/1997 |
|---|---|---|
| JP | 2008118821 A | 5/2008 |

OTHER PUBLICATIONS

English translation of the Written Opinion for International Application No. PCT/FR2017/052399, dated Dec. 15, 2017—6 pages.

(Continued)

*Primary Examiner* — Bentsu Ro
(74) *Attorney, Agent, or Firm* — RatnerPrestia

(57) ABSTRACT

A method for supplying power to an inductive load including an H-bridge switching structure coupled to a power supply and including a first, a second, a third and a fourth switch and current measurement means designed to measure a current through each switch, the power supply method including: a) supplying power to the inductive load, b) reducing an accumulated current in the inductive load. Upon detection of an anomaly: c) identifying the switch that caused a circuit break, d) identifying whether the anomaly was detected during step a) or step b). If an anomaly is detected in step a): e) performing step b) for a third duration, f) identifying the origin of the anomaly, g) if an anomaly is detected in step b): h) identifying the origin of the anomaly.

10 Claims, 2 Drawing Sheets

(51) Int. Cl.
  *H02P 7/03* (2016.01)
  *G01R 31/34* (2006.01)
  *H01H 71/12* (2006.01)

(56) References Cited

U.S. PATENT DOCUMENTS

| | | | | |
|---|---|---|---|---|
| 5,703,490 | A * | 12/1997 | Kennedy | G01R 19/0092 |
| | | | | 324/650 |
| 6,056,384 | A * | 5/2000 | Sato | G01R 31/024 |
| | | | | 318/400.21 |
| 7,933,110 | B2 * | 4/2011 | Takahashi | H01H 3/001 |
| | | | | 361/160 |
| 2005/0088126 | A1 | 4/2005 | Kawashima et al. | |
| 2013/0083434 | A1 | 4/2013 | Barth | |
| 2014/0333320 | A1 | 11/2014 | Barnetova | |

OTHER PUBLICATIONS

International Search Report and Written Opinion for International Application No. PCT/FR2017/052399, dated Dec. 15, 2017—9 pages.

* cited by examiner

METHOD FOR SUPPLYING AN INDUCTIVE LOAD

CROSS REFERENCE TO RELATED APPLICATIONS

This application is the U.S. National Phase Application of PCT International Application No. PCT/FR2017/052399, filed Sep. 11, 2017, which claims priority to French Patent Application No. 1658578, filed Sep. 14, 2016, the contents of such applications being incorporated by reference herein.

FIELD OF THE INVENTION

The present invention generally pertains to supplying power to inductive loads.

It relates more particularly to the detection of anomalies, and more precisely of short circuits that may occur in a switching structure, such as for example a switch bridge used to drive a current in an inductive load.

The invention is applicable in particular in the automotive field. It is able to be implemented for example in an electronic circuit incorporating a switching structure, such as a transistor H-bridge.

BACKGROUND OF THE INVENTION

A motor vehicle contains numerous inductive loads, such as for example electric motors. These electric motors may also be used in electronic actuator control systems. This may be for example an electronic throttle control (ETC) device, or an exhaust gas recirculation (EGR device) valve, or any other valve used in engine control. More generally, it may be any other apparatus actuated by an electric motor, such as a power window for example.

The power supply of such inductive loads generally uses a switching structure, such as a bridge of switches positioned in an H. An H-bridge comprises four power switches, namely two "high-side" switches on the side of a positive power supply, for example a battery, and two "low-side" switches on the side of a negative power supply or of an electrical ground of the motor vehicle. Each switch generally includes a power MOS ("metal-oxide semiconductor") transistor.

A sequence of analog control signals for the four switches is produced from a setpoint control signal. The setpoint control signal and the analog control signals are generally pulse-width-modulated signals, or PWM signals. The duty cycle of the PWM signals drives the amount of current injected into the inductive load and therefore, on average, the intensity of the current in this inductive load.

Depending on the control strategies, the H-bridge is actuated in given and authorized configurations. By contrast, other configurations are prohibited, such as for example a configuration in which a high-side switch and a low-side switch would be closed together, creating a short circuit between the battery and ground.

However, when controlling the switches of the H-bridge, it is possible for short circuits to occur either at an output of the H-bridge or in the inductive load. Discriminating a short circuit to ground or to the battery at an output of the H-bridge with respect to a short circuit of the inductive load (short-circuited electric motor winding) is not a trivial matter. Specifically, simply detecting a short circuit by way of a current measurement at each transistor sometimes does not make it possible to ascertain whether the short circuit originates from contact of an output with ground or with the battery or from the inductive load.

Numerous techniques are known to those skilled in the art for detecting a short circuit in the inductive load. Mention may be made for example of one solution that consists in applying a current in a direction opposite to the direction of the nominal operating current of the transistors of the H-bridge, that is to say the direction of the current in which the short circuit has been detected. To this end, the two transistors complementary to the two transistors that are actuated in the nominal operating direction are activated for a relatively short time. Of course, the two transistors used for nominal operation of the H-bridge are inactive in this case. If a short circuit is detected upon activation of the two complementary transistors, then this means that the short circuit that is detected originates from the inductive load. However, applying a reverse current to the inductive load causes the latter to drift, which may be detrimental in some cases.

Furthermore, such a method does not exhibit very good performance in the case of intermittent short circuits, which may lead to an erroneous conclusion as to the location of said short circuits.

SUMMARY OF THE INVENTION

An aspect of the invention proposes a method intended to detect a short circuit in an H-bridge structure coupled to an inductive load, without movement of the latter. The proposed solution thus makes it possible to keep the same position of the inductive load during the detection of the short circuit.

To this end, a first aspect of the invention proposes a method for supplying power to an inductive load comprising:
  an H-bridge switching structure coupled to a positive power supply and to an electrical ground and including a first, a second, a third and a fourth switch that are distributed over two branches of the H-bridge, said four switches being positioned with respect to said inductive load such that closing a first pair of switches formed by the first and third switches allows a current to flow through the inductive load in a forward direction, and that closing a second pair of switches, comprising the second and fourth switches, allows a current to flow through the inductive load in a reverse direction,
  current measurement means designed to measure a current through each switch, the power supply method comprising the following steps:
    a) supplying power to the inductive load for a first given duration by way of the first pair of switches or of the second pair of switches,
    b) reducing an accumulated current in the inductive load after the step of supplying power to the inductive load, for a second given duration, by closing a third pair of switches formed by the second and third switches, or by closing a fourth pair of switches, formed by the first and fourth switches,
  characterized in that it furthermore includes, upon detection of an anomaly by way of the current measurement means at a switch during step a) or step b), the following steps:
    c) identifying the switch out of the four switches that caused the circuit break,
    d) identifying whether the anomaly was detected during step a) or step b), anomaly detected in step a):
    e) performing step b) with another pair of switches for a third duration,
    f) identifying the origin of the anomaly,
anomaly detected in step b):
    g) identifying the origin of the anomaly.

By virtue of such a method, it is now possible to detect an anomaly, for example a short circuit, in the structure of the H-bridge.

To detect the origin of the anomaly, it is proposed for example to detect the presence of a circuit break on the basis of one of the two activated switches. This thus makes it possible in some cases, depending on the state of the H-bridge, to ascertain the origin of the short circuit without an additional step.

It is advantageously proposed for example to perform a step of identifying the origin of the anomaly in the inductive load, thus making it possible to detect whether the anomaly originates therefrom.

To optimize identification of the anomaly, a step of identifying the origin of the anomaly in the branch of the switch that caused the circuit break is proposed for example.

To be certain of the origin of the anomaly, in another exemplary embodiment of the method, a step for detecting the presence of a detection on the basis of the same switch is performed.

As a variant, a step of identifying the origin of the anomaly in the branch of the switch that caused the circuit break is also proposed for example.

To optimize control of the H-bridge, it is proposed, in another exemplary embodiment of the method, for the first duration to have a time equal to the second duration.

In one variant, the first duration has a time different from the second duration.

To optimize detection of an anomaly, it is proposed for example for the third duration to have a time different from the time of the second duration.

BRIEF DESCRIPTION OF THE DRAWINGS

Other features and advantages of aspects of the invention will become more apparent upon reading the following description. This description is purely illustrative and should be read with reference to the appended drawings, in which.

DETAILED DESCRIPTION OF THE PREFERRED EMBODIMENTS

Figure 1:
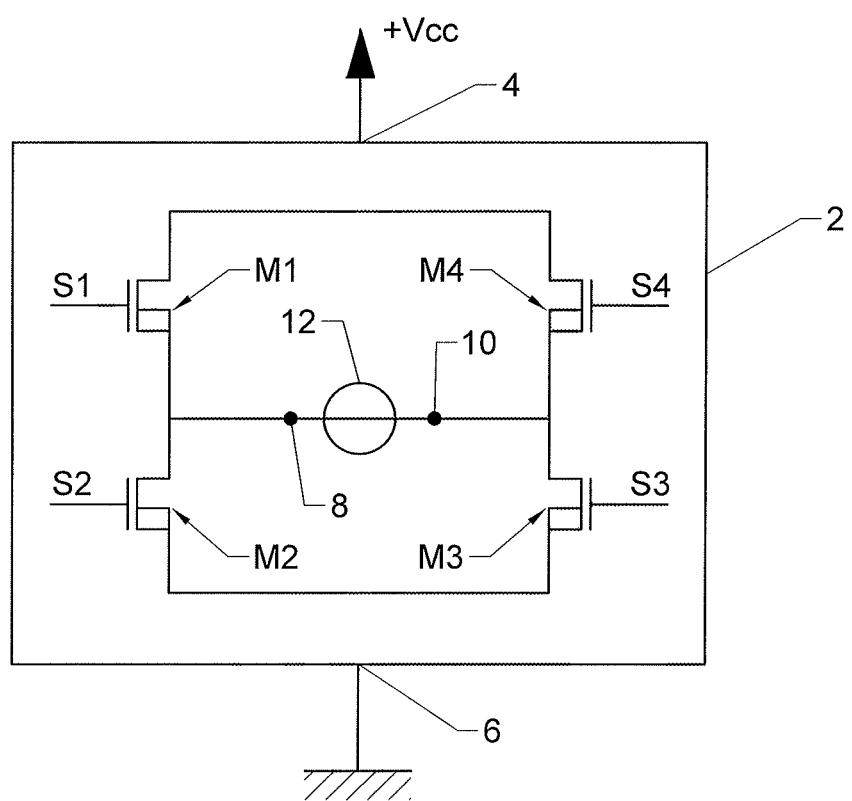
FIG. 1 is a circuit diagram of an example of a switching structure comprising an H-bridge.

FIG. 1 shows a structure of a conventional H-bridge 2, which includes, inter alia, four power switches each formed for example of a power MOS ("metal-oxide semiconductor") transistor. The H-bridge 2 is coupled to a positive power supply via a first terminal 4 and to a negative power supply via a second terminal 6. The positive power supply may be a battery of a motor vehicle delivering a voltage +VCC, and the negative power supply may be an electrical ground of the battery and/or of the motor vehicle. The H-bridge 2 furthermore includes a first control output 8 and a second control output 10. An inductive load 12 is coupled between the first control output 8 and the second control output 10. The inductive load 12 is an electric motor, for example.

The H-bridge 2 also includes a first transistor M1 coupled between the first terminal 4 and the first control output 8; a second transistor M2 coupled between the second terminal 6 and the first control output 8; a third transistor M3 coupled between the second terminal 6 and the second control output 10, and lastly a fourth transistor M4 coupled between the first terminal 4 and the second control output 10. The first transistor M1 and the fourth transistor M4 may also be called high-side transistors. The second transistor M2 and the third transistor M3 may also be called low-side transistors.

To control the inductive load 12, a first analog signal S1, a second analog signal S2, a third analog signal S3 and lastly a fourth analog signal S4 are applied to the transistors M1 to M4, respectively. The H-bridge 2, through the state of the transistors M1 to M4, thus controls the inductive load 12.

Theoretically, the transistors M1, M2, M3 and M4 are driven by logic signals, but what puts these signals into the analog category is a floating voltage reference of the high-side transistors, and secondly the management of the switching slopes of certain transistors.

The analog signals S1 to S4 originate from a control signal (not shown in FIG. 1) having a variable duty cycle, or also called initial PWM ("pulse width modulation") signal. The initial PWM signal has a frequency that may reach at least 10 kHz (1 kHz=1000 Hz), thereby giving a period T of around 100 μs (1 μs=$10^{-6}$ s) or less.

Figure 2A:
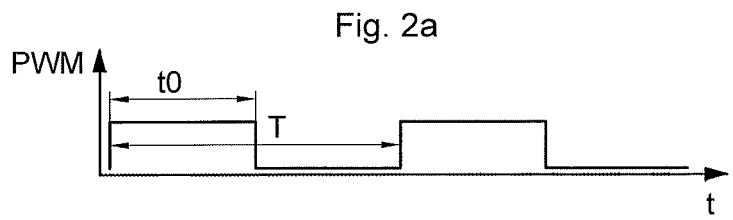
FIGS. 2a and 2b are graphs showing a pulse-width-modulated periodic setpoint control signal, and the corresponding evolution of the current in the controlled inductive load.

As shown in FIG. 2a, such an initial PWM signal is, at each period T, in a given first logic state from among the high and low logic states during a first fraction of the period T, and in another logic state during the rest of the period T. In the example shown in FIG. 2a, the initial PWM signal is in the high logic state for a duration $t_0$ shorter than the period T, also called activation duration. The duty cycle of the initial PWM signal $d_{com}$ is given by:

$$d_{com}=t_0/T \quad (1)$$

The duty cycle of the initial PWM signal $d_{com}$ may vary between 0% and 100%. It is admissible for the short-circuit detection to be fully operational only between 20% and 80%, but it is preferable for it to be so between 10% and 90%.

Figure 2B:
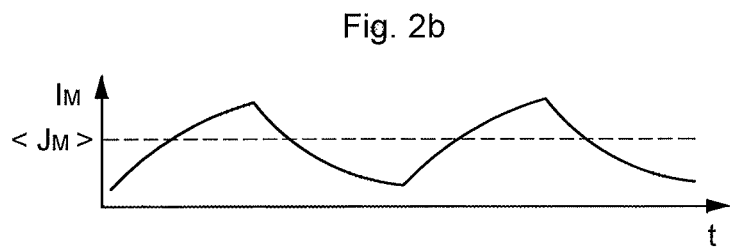

FIG. 2b shows the evolution of the instantaneous value of a current $I_M$ in the inductive load 12, obtained in response to the initial PWM signal of FIG. 2a.

During the activation duration of the initial PWM signal, that is to say, in the example, when this signal is in the high logic state, the current $I_M$ increases in the inductive load 12 toward a given maximum value. This maximum value corresponds to the ratio between the supply voltage +VCC divided by the value of a total resistance. The H-bridge 2 is then controlled in a first or a second state, as will be presented later on.

During the deactivation period of the initial PWM signal, that is to say, in the example, when this signal is in the low logic state, the current $I_M$ decreases toward a zero value. Due to the inductive nature of the inductive load 12, the rises and falls of the current $I_M$ have a shallow slope, rather than following the pattern of the square edges of the initial PWM signal.

The average value $<I_M>$ of the current $I_M$ is given by:

$$<I_M> = d_{com} \times VCC \times 1/R \qquad (2)$$

where R is essentially the value of the impedance of the inductive load 12. The other resistive elements are values of the resistances, in the on state, of the transistors M1 to M4, called $RDS_{ON}$, and of the resistances of the wires, of the connections and of the tracks of the printed circuit board.

Depending on the state of the initial PWM signal and therefore on the state of the analog signals S1 to S4, the H-bridge 2 is preferably able to be controlled in accordance with three possible states or configurations, described below with reference to FIGS. 3a, 3b and 3c.

Figure 3A:
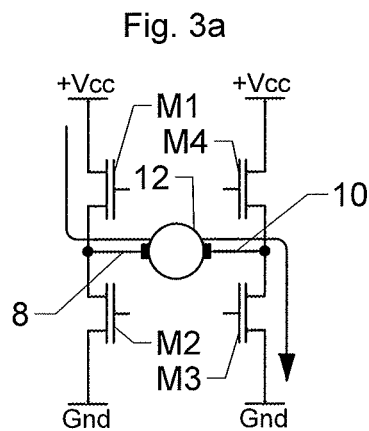
FIGS. 3a, 3b, 3c and 3d are diagrams illustrating configurations for controlling an inductive load using the H-bridge of FIG. 1.

In a first state, the pair formed of the first transistor M1 and of the third transistor M3 makes it possible, when these transistors are in the on state (switches closed), to channel a current through the inductive load 12 in a first direction, from +VCC to electrical ground, as indicated by an arrow in FIG. 3a. The second transistor M2 and the fourth transistor M4 are then in the off state (switches open).

Figure 3B:
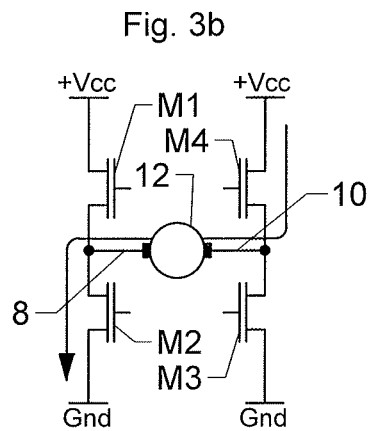

By contrast, in a second state, the pair formed of the second transistor M2 and of the fourth transistor M4 makes it possible, when these transistors are in the on state (switches closed), to channel a current through the inductive load 12 in the other direction, still from +VCC to electrical ground, as indicated by the arrow in FIG. 3b. The first transistor M1 and the third transistor M3 are then in the off state (switches open).

Figure 3C:
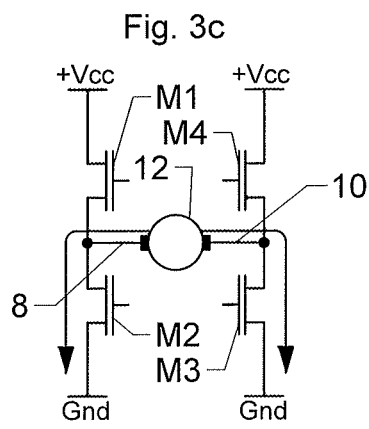

Lastly, in a third state illustrated by FIG. 3c, the first transistor M1 and the fourth transistor M4 are in the off state (switches open) and the second transistor M2 and the third transistor M3 are in the on state (switches closed). This makes it possible to evacuate the power accumulated in the inductive load 12, in the form of a current flowing to electrical ground through the second transistor M2 and the third transistor M3, as shown by the two arrows in FIG. 3c. The direction of the current is then imposed by the inductive load 10. This state is called a "freewheeling" state. It is able to be controlled following operation of the H-bridge 2 in the first state or the second state, mentioned above, after the opening of the first transistor M1 or of the fourth transistor M4, respectively.

It should be noted that the freewheeling state described above and shown in FIG. 3c may also be produced using other means. Specifically, it is also possible to use structural diodes, making it possible to have a single transistor in the on state.

The H-bridge 2 is implemented, that is to say that it is designed optimally, for a given freewheeling state. Thus, for example, the H-bridge 2 is implemented for a "low-side" freewheeling state, such as the one illustrated in FIG. 3c. With such an implementation, the two transistors thus contributing to the low-side freewheeling, that is to say the second transistor M2 and the third transistor M3, in the majority of implementations, have very close switching times so as to exhibit slightly lower heating.

Figure 3D:
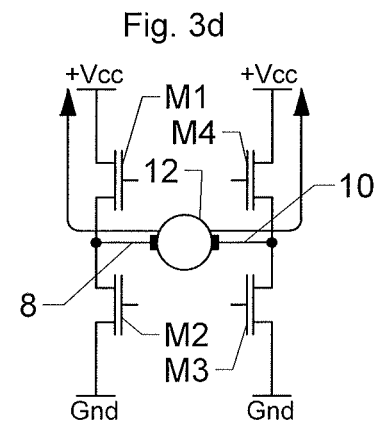

However, the H-bridge 2 may also be put into a fourth state, illustrated by FIG. 3d. In this fourth state, the first transistor M1 and the fourth transistor M4 are in the on state (switches closed) and the second transistor M2 and the third transistor M3 are in the off state (switches open). This makes it possible to evacuate the power accumulated in the inductive load 12, in the form of a current flowing to the positive power supply +VCC, through the first transistor M1 and the fourth transistor M4, as shown by the two arrows in FIG. 3d. This state is called a "high-side" freewheeling state. It is able to be controlled following operation of the H-bridge 2 in the first state or the second state, mentioned above, after the opening of the second transistor M2 or of the third transistor M3, respectively. The direction of the current is then imposed by the inductive load 12.

By contrast, other configurations of the H-bridge 2 are prohibited, such as for example a configuration in which the first transistor M1 and the second transistor M2 would be in the on state, so as to avoid connecting the positive power supply through the first terminal 4 to electrical ground through the second terminal 6 of the H-bridge 2. Other configurations are also prohibited, and will be presented later on.

It will be appreciated that an aspect of the invention is not limited to this type of switching structure. In particular, it also applies to a half-bridge switching structure, that is to say with just two power MOS transistors, and after having reconstructed an H-bridge from two half-bridges. Also, the implementation form of the power switch or switches shown in FIGS. 3a, 3b, 3c and 3d is merely a nonlimiting example. These switches may each comprise a type of transistor other than the transistor, such as for example a bipolar junction transistor (BJT) or an insulated-gate bipolar transistor (IGBT) rather than an MOS transistor. They may also comprise an assembly of such transistors, possibly with other components such as resistors, capacitors, etc.

When such an H-bridge 2 is used to control the inductive load 12, physical anomalies external to the structure of the H-bridge 2 may occur at the first control output 8 and the second control output 10, but also in the inductive load 12. These anomalies are in particular short circuits at the first control output 8 and the second control output 10, in particular with possible short circuits:

between the first control output 8 and electrical ground,
between the first control output 8 and the voltage +VCC,
between the second control output 10 and electrical ground,
between the second control output 10 and the voltage +VCC, and
between the first control output 8 and the second control output 10.

These short circuits are able to be detected by virtue of measuring the current in the transistors, in the form of an abnormal increase in the current in certain configurations of the H-bridge 2. However, the last case cited above, that is to say in the presence of a short circuit in the inductive load 12, is difficult to detect due to the internal structure of the H-bridge 2 and to the many possible causes of failure.

Figure 4:
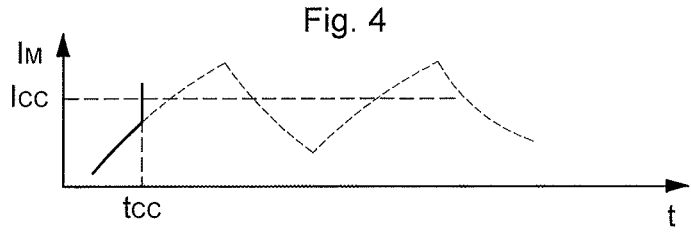
FIG. 4 is a graph illustrating a short circuit in the structure of the H-bridge.

A short circuit in the inductive load 12 is characterized by a strong reduction in its impedance (resistance and inductance). Short circuits in general, that is to say at each transistor of the H-bridge 2, and especially short circuits in the inductive load 12, are liable to impact the correct operation of the H-bridge 2, possibly to the extent that it is destroyed. FIG. 4 illustrates a typical current rise at the terminals of a transistor of the H-bridge 2 in the presence of a short circuit. One of the transistors then triggers the circuit break when the current flowing through it is above a threshold value, called Icc, at a time called tcc. Means that are known to those skilled in the art are used to perform these circuit breaks.

An aspect of the present invention proposes a method for controlling the H-bridge 2 that is able to discriminate between a short circuit of the inductive load 12 and another short circuit applied to the H-bridge 2. The method presented below uses short-circuit detectors, known to those skilled in the art for example, and means for measuring the current in each transistor M1 to M4. Of course, this current measurement is only possible when the transistor is closed. Since the architecture used to design this type of current detector is well known to those skilled in the art, it will not be described in more detail here. Advantageously, the method of an aspect of the present invention does not use a current detector in the inductive load 12.

As was mentioned earlier on in the description, depending on the state of the initial PWM signal and therefore depending on the analog signals S1 to S4, the H-bridge 2 is able to adopt the states shown in FIGS. 3a to 3d.

To control such an H-bridge 2, it is known to those skilled in the art to use another signal, called DIR, which makes it possible to impose the direction of the current in the H-bridge 2.

Table 1 shows the various states of the transistors M1 to M4 as a function of the initial PWM signal and of the DIR signal in the case of a low-side freewheeling implementation, that is to say on the electrical ground side, as mentioned above.

TABLE 1

States of the transistors (M1 to M4) as a function of the PWM control signal and of the DIR signal for an H-bridge structure with a low-side freewheeling implementation.

| | | | | Commutateurs fermés | | | |
|---|---|---|---|---|---|---|---|
| Cas N° | Détecté par | DIR | PWM | M1 | M4 | M2 | M3 |
| 1 | M1 | 0 | 0 | | | M2 | M3 |
| 2 | | | 1 | | M4 | M2 | |
| 3 | | 1 | 0 | | | M2 | M3 |
| 4 | | | 1 | M1 | | | M3 |
| 5 | M4 | 0 | 0 | | | M2 | M3 |
| 6 | | | 1 | | M4 | M2 | |
| 7 | | 1 | 0 | | | M2 | M3 |
| 8 | | | 1 | M1 | | | M3 |
| 9 | M2 | 0 | 0 | | | M2 | M3 |
| 10 | | | 1 | | M4 | M2 | |
| 11 | | 1 | 0 | | | M2 | M3 |
| 12 | | | 1 | M1 | | | M3 |
| 13 | M3 | 0 | 0 | | | M2 | M3 |
| 14 | | | 1 | | M4 | M2 | |
| 15 | | 1 | 0 | | | M2 | M3 |
| 16 | | | 1 | M1 | | | M3 |

Cases 1, 2, 3, 5, 7, 8, 12 and 14 in table 1 are cases considered to be impossible, as the open switches are not able to give rise to a detection. The eight remaining cases, that is to say cases 4, 6, 9, 10, 11, 13, 15 and 16 in table 1, will be analyzed in the description below.

Case 4 corresponds to a high state of the DIR signal and to a high state of the initial PWM signal. Thus, in this case, when DIR=1 and PWM=1, the first transistor M1 and the third transistor M3 are in the on state, and the second transistor M2 and the fourth transistor M4 are in the off state. These transistors are controlled by the signals S1 to S4 derived from the initial PWM signal.

Case 4 corresponds to the state of the H-bridge 2 of FIG. 3a, that is to say that a current flows through the first transistor M1, the inductive load 12 and the third transistor M3. It is possible for a short circuit of the inductive load 12 to occur when the analog signals S1 to S4 are applied to the transistors M1 to M4, that is to say upon actuation of the inductive load 12; or during operation thereof, that is to say when the inductive load 12 is already active, for example when the electric motor is rotating. Such a short circuit leads to a sharp rise in the current in the circuit corresponding to the first transistor M1, the inductive load 12 and the third transistor M3, leading either to a circuit break of the first transistor M1 or to a circuit break of the third transistor M3.

In case 4 explained here, the scenario given is that the first transistor M1 triggers the circuit break first of all. Those skilled in the art will readily understand that, due to the internal structure of a transistor, the first transistor M1 and the third transistor M3 have slightly different intrinsic characteristics and therefore slightly different sensitivities, which may warrant such a circuit break of the first transistor M1.

The internal structure of the H-bridge 2 in case 4 does not make it possible to ascertain whether the increase in the current originates from a short circuit of the inductive load 12 or from a ground short circuit at the first control output 8.

The method of an aspect of the present invention proposes, if a current increase is detected at the first transistor M1 when the H-bridge 2 is in case 4, to ascertain whether this current rise originates from a ground short circuit at the first control output 8 or from a short circuit of the inductive load 12.

To this end, a first test step is expediently proposed for removing the abovementioned doubt. This first test step consists in modifying the state of the third transistor M3 from an on state to an off state. Reactivating the first transistor M1 in the same on state and modifying the state of the fourth transistor M4, that is to say from an off state to an on state. This modification of the states of the transistors mentioned above makes it possible to switch the H-bridge 2 into a high-side freewheeling mode corresponding to FIG. 3c. As mentioned above in the description, this high-side freewheeling state is not the one used to establish table 1, but is authorized due to the control structure of the H-bridge 2.

This first test step, and therefore the modification of the states of the transistors, is performed after a short circuit is detected. In this case, when for example the inductive load 12 is an electric motor, then the latter may be in a deceleration phase or at a standstill.

Once the high-side freewheeling has been performed, following the circuit break triggered by the first transistor M1 in case 4, the method of an aspect of the present invention is advantageously able to detect the origin of said short circuit. Specifically, in the high-side freewheeling state, if the first transistor M1 triggers the circuit break again, that is to say that a sharp current rise is detected through the first transistor M1, then this means that there is a short circuit present between the first control output 8 and ground.

If a circuit break is not triggered by the first transistor M1 in the high-side freewheeling, then the detected short circuit originates from the inductive load 12 in this case.

Thus, by virtue of the high-side freewheeling state in case 4 after a short circuit has been detected, it is possible to determine whether the detected short circuit is a short circuit to ground at the first control output 8, or a short circuit in the inductive load 12. Advantageously, the duration of such a test is very short. Furthermore, the inductive load 12 is not activated during this test, thereby avoiding movement or drifting thereof.

In one variant embodiment of the method of an aspect of the invention, as a substitute for the first test step, a second test step is proposed in which only the first transistor M1 is in the on state. In this second test step, if a current rise is again detected, this means that a ground short circuit is present at the first control output 8. If a current rise is not detected at the first transistor M1, then this means that a short circuit is present in the inductive load 12. Advantageously, this second test step makes it possible, after a current rise has been detected in case 4, to ascertain the origin of the short circuit only by deactivating the third transistor M3.

Case 6 corresponds to a low state of the DIR signal and to a high state of the initial PWM signal. Thus, when DIR=0 and PWM=1, the second transistor M2 and the fourth transistor M4 are in the on state, and the first transistor M1 and the third transistor M3 are in the off state. Case 6 corresponds to the state of the H-bridge 2 of FIG. 3b, that is to say that a current flows through the fourth transistor M4, the inductive load 12 and the second transistor M2. It is possible for a short circuit to occur in the inductive load 12 and lead to a sharp rise in the current in the corresponding circuit. This current rise may lead to a circuit break, either on the basis of the second transistor M2 or on the basis of the fourth transistor M4. In case 6, according to table 1, we start from the scenario in which it is the fourth transistor M4 that triggers the circuit break first of all.

The internal structure of the H-bridge 2 in case 6 does not make it possible to ascertain whether the increase in the current originates from a short circuit of the inductive load 12 or from a ground short circuit at the second control output 10.

To remove the doubt in case 6, a third test step is performed and consists in modifying the state of the second transistor M2 from an on state to an off state. Reactivating the fourth transistor M4 in the same on state and modifying the state of the first transistor M1, that is to say from an off state to an on state. This modification of the states of certain transistors makes it possible to switch the H-bridge 2 into a high-side freewheeling mode, illustrated in FIG. 3d.

This third test step is performed after the short circuit has been detected in the corresponding circuit. Once the high-side freewheeling has been performed, following the circuit break on the basis of the fourth transistor M4 in case 6, the method of an aspect of the present invention is able to detect the origin of said short circuit.

Specifically, in the high-side freewheeling state, if the fourth transistor M4 triggers the circuit break again, that is to say that a sharp current rise is detected at its terminals, then this means that there is a short circuit between the second control output 10 and ground.

If there is no circuit break on the basis of the fourth transistor M4, then this means that the short circuit originates from the inductive load 12.

Thus, by virtue of this third step and of its high-side freewheeling phase, it is possible to determine whether the detected short circuit is a short circuit to ground at the second control output 10, or a short circuit in the inductive load 12. Furthermore, in case 6, the inductive load 12 is not activated during this test.

In another variant embodiment of the method of an aspect of the invention, as a substitute for the third test step, a fourth test step is proposed in which only the fourth transistor M4 is in the on state. In this fourth test step, if a current rise is again detected, this means that a ground short circuit is present at the second control output 10. If a current rise is not detected, then this means that a short circuit is present in the inductive load 12.

Advantageously, the fourth test step makes it possible, after a current rise has been detected, to ascertain the origin of the short circuit only by deactivating the second transistor M2.

Case 9 corresponds to a low state of the DIR signal and to a low state of the initial PWM signal. Thus, when DIR=0 and PWM=0, the second transistor M2 and the third transistor M3 are in the on state, and the first transistor M1 and the fourth transistor M4 are in the off state. Case 9 corresponds to the state of the H-bridge 2 in low-side freewheeling (FIG. 3c), that is to say that a current flows through the second transistor M2, the inductive load 12 and the third transistor M3. It is possible for a battery voltage short circuit to occur at the first control output 8 and lead to a sharp rise in the current in the corresponding circuit. This current rise leads to a circuit break on the basis of the transistor M2.

In case 9, in the circuit break on the basis of the second transistor M2, the only possibility is a short circuit between the first control output 8 and the battery voltage +Vcc. Advantageously, the method of an aspect of the present invention does not require an additional test step in case 9, that is to say upon detection of a short circuit during the low-side freewheeling phase.

Case 10 corresponds to a low state of the DIR signal and to a high state of the initial PWM signal. Thus, when DIR=0 and PWM=1, the second transistor M2 and the fourth transistor M4 are closed, and the first transistor M1 and the third transistor M3 are open. Case 10 (like case 6) corresponds to the state of the H-bridge 2 of FIG. 3b, that is to say that a current flows through the fourth transistor M4, the inductive load 12 and the second transistor M2. It is possible in this case for a short circuit to occur in the inductive load 12 and lead to a sharp rise in the current in the corresponding circuit. In case 10, according to table 1, we will start from the scenario in which it is the second transistor M2 that triggers the circuit break first of all.

The internal structure of the H-bridge 2 in case 10 does not make it possible to ascertain whether the increase in the current originates from a short circuit of the inductive load 12 or from a battery short circuit at the first control output 8.

To remove the doubt in case 10, a fifth test step is performed and consists in modifying the state of the fourth transistor M4 from an on state to an off state. Reactivating the second transistor M2 in the same on state and modifying the state of the third transistor M3, that is to say from an off state to an on state. This modification of the states of the transistors makes it possible to switch the H-bridge 2 into a low-side freewheeling mode.

This fifth test step, and therefore the modification of the states of the transistors, is performed after the short circuit has been detected. Once the low-side freewheeling has been performed, following the circuit break on the basis of the second transistor M2 in case 10, the method of an aspect of the present invention is advantageously able to detect the origin of the short circuit. Specifically, in the low-side freewheeling state, if the second transistor M2 triggers the circuit break again, that is to say that a sharp current rise is detected there, then this means that there is a short circuit between the first control output 8 and the battery voltage. If there is no circuit break on the basis of the second transistor M2, then this means that the short circuit originates from the inductive load 12.

Thus, by virtue of this low-side freewheeling phase in case 10, it is possible to determine whether the detected short circuit is a battery short circuit at the first control output 8, or a short circuit in the inductive load 12.

In another variant embodiment of the method of an aspect of the invention, as a substitute for the fifth test step, a sixth test step is proposed in which only the second transistor M2 is in the on state. In this sixth test step, if a current rise is again detected, this means that a battery short circuit is present at the first control output 8. If a current rise is not detected, then this means that a short circuit is present in the inductive load 12. Advantageously, this sixth test step makes it possible, only by deactivating the fourth transistor M4 after a current rise has been detected during case 10, to ascertain the origin of the short circuit.

Case 11 corresponds to a high state of the DIR signal and to a low state of the initial PWM signal. Thus, when DIR=1 and PWM=0, the second transistor M2 and the third transistor M3 are in the on state, and the first transistor M1 and the fourth transistor M4 are in the off state. Case 11 is identical to case 9. Advantageously, the short-circuit detection strategy in the present case will be identical to case 9 explained above.

Case 13 corresponds to a low state of the DIR signal and to a low state of the initial PWM signal. Thus, when DIR=0 and PWM=0, the second transistor M2 and the third transistor M3 are in the on state, and the first transistor M1 and the fourth transistor M4 are in the off state. Case 13 corresponds to the state of the H-bridge 2 in low-side freewheeling (FIG. 3c), that is to say that a current flows through the second transistor M2, the inductive load 12 and the third transistor M3. In case 13, according to table 1, we start from the scenario in which it is the third transistor M3 that triggers the circuit break first of all.

Advantageously, in case 13 and in the circuit break on the basis of the third transistor M3, the only possibility is a short circuit between the battery voltage +VCC and the second control output 10. Advantageously, the method of an aspect of the present invention does not require an additional test step in case 13, that is to say upon detection of a short circuit during a low-side freewheeling phase.

Case 15 corresponds to a high state of the DIR signal and to a low state of the initial PWM signal. Thus, when DIR=1 and PWM=0, the second transistor M2 and the third transistor M3 are in the on state, and the first transistor M1 and the fourth transistor M4 are in the off state. Case 15 corresponds to the state of the H-bridge 2 in low-side freewheeling FIG. 3c, that is to say that a current flows through the second transistor M2, the inductive load 12 and the third transistor M3. Advantageously, case 15 uses the same strategy as that explained in case 13, and it will therefore not be described further here.

Case 16 corresponds to a high state of the DIR signal and to a high state of the initial PWM signal. Thus, when DIR=1 and PWM=1, the first transistor M1 and the third transistor M3 are in the on state, and the second transistor M2 and the fourth transistor M4 are in the off state. Case 16 corresponds to the state of the H-bridge 2 of FIG. 3a, that is to say that a current flows through the first transistor M1, the inductive load 12 and the third transistor M3. Upon a short circuit, in case 16 according to table 1, the initial scenario is given that the third transistor M3 causes the circuit break first of all.

The internal structure of the H-bridge 2 in case 16 does not make it possible to ascertain whether the increase in the current originates from a short circuit of the inductive load 12 or from a battery short circuit at the second control output 10.

The method of an aspect of the present invention proposes, if a current increase is detected at the third transistor M3 when the H-bridge 2 is in case 16, to ascertain whether this current rise originates from a battery short circuit at the second control output 10 or from a short circuit of the inductive load 12.

To this end, a seventh test step is performed and consists in modifying the state of the first transistor M1 from an on state to an off state. Reactivating the third transistor M3 in the same on state and modifying the state of the second transistor M2, that is to say from an off state to an on state.

This modification of the states of certain transistors makes it possible to switch the H-bridge 2 into a low-side freewheeling mode.

This seventh test step, and therefore the modification of the states of the transistors, is performed after the short circuit has been detected. Once the low-side freewheeling has been performed, following the circuit break on the basis of the third transistor M3 in case 16, the method of an aspect of the present invention is advantageously able to detect the origin of the short circuit. Specifically, in the low-side freewheeling state, if the third transistor M3 triggers a circuit break again, that is to say that a sharp current rise is detected there, then this means that there is a short circuit between the second control output 10 and the battery. If there is no circuit break on the basis of the third transistor M3, then this means that the short circuit originates from the inductive load 12.

Thus, by virtue of this low-side freewheeling phase, it is possible to determine whether the detected short circuit is a battery short circuit at the second control output 10 or a short circuit in the inductive load 12.

In one variant embodiment of the method of an aspect of the invention, as a substitute for the seventh test step, an eighth test step is proposed in which only the third transistor M3 is activated, that is to say in the on state. In this eighth test step, if a current rise is again detected, this means that a battery short circuit is present at the second control output 10. If a current rise is not detected, then this means that a short circuit is present in the inductive load 12. Advantageously, this eighth test step makes it possible to ascertain the origin of the short circuit only by deactivating the second transistor M2.

Table 2 shows the various states of the transistors M1 to M4 as a function of the initial PWM signal and of the DIR signal in the case of a high-side freewheeling implementation, that is to say on the battery side.

TABLE 2

States of the transistors (M1 to M4) as a function of the PWM control signal and of the DIR signal for a structure of the H-bridge 2 with a low-side freewheeling implementation.

| Case no. | Detected by | DIR | PWM | Switcher closed | | | |
|---|---|---|---|---|---|---|---|
| | | | | M1 | M4 | M2 | M3 |
| 17 | M1 | 0 | 0 | M1 | M4 | | |
| 18 | | | 1 | | M4 | M2 | |
| 19 | | 1 | 0 | M1 | M4 | | |
| 20 | | | 1 | M1 | | | M3 |
| 21 | M4 | 0 | 0 | M1 | M4 | | |
| 22 | | | 1 | | M4 | M2 | |
| 23 | | 1 | 0 | M1 | M4 | | |
| 24 | | | 1 | M1 | | | M3 |
| 25 | M2 | 0 | 0 | M1 | M4 | | |
| 26 | | | 1 | | M4 | M2 | |
| 27 | | 1 | 0 | M1 | M4 | | |
| 28 | | | 1 | M1 | | | M3 |
| 29 | M3 | 0 | 0 | M1 | M4 | | |
| 30 | | | 1 | | M4 | M2 | |
| 31 | | 1 | 0 | M1 | M4 | | |
| 32 | | | 1 | M1 | | | M3 |

Cases 18, 24, 25, 27, 28, 29, 30 and 31 are cases considered to be impossible, as the switches in the off state are not able to give rise to a detection. The other eight cases present in table 2, that is to say cases 17, 19, 20, 21, 22, 23, 26 and 32, will be analyzed below.

Case 17 corresponds to a low state of the DIR signal and to a low state of the initial PWM signal. Thus, when DIR=0 and PWM=0, the first transistor M1 and the fourth transistor M4 are in the on state, and the second transistor M2 and the third transistor M3 are in the off state. Case 17 corresponds to the state of the H-bridge 2 of FIG. 3d, that is to say a high-side freewheeling state. Thus, in case 17, a current flows through the first transistor M1, the inductive load 12 and the fourth transistor M4. It is possible for a ground short circuit to occur at the first control output 8 and lead to a sharp rise in the current in the corresponding circuit. In case 17, according to table 2, we start from the scenario in which it is the first transistor M1 that triggers the circuit break first of all.

Advantageously, in case 17 and upon the circuit break of the first transistor M1, the only possible short circuit is a ground short circuit at the first control output 8. Advantageously, according to the method of an aspect of the present invention, it is not necessary to have an additional test step in case 17, that is to say upon detection of a short circuit during the low-side freewheeling phase.

Case 19 corresponds to a high state of the DIR signal and to a low state of the initial PWM signal. Thus, when DIR=1 and PWM=0, the first transistor M1 and the fourth transistor M4 are in the on state, and the second transistor M2 and the third transistor M3 are in the off state. Case 19 corresponds to the state of the H-bridge 2 of FIG. 3d, that is to say a high-side freewheeling state.

Advantageously, the steps of the method of an aspect of the present invention for detecting the presence of a ground short circuit at the first control output 8 are identical to the steps of case 17, and they will therefore not be presented further here.

Case 20 corresponds to a high state of the DIR signal and to a high state of the initial PWM signal. Thus, when DIR=1 and PWM=1, the first transistor M1 and the third transistor M3 are in the on state, and the second transistor M2 and the fourth transistor M4 are in the off state. Case 12 corresponds to the state of the H-bridge 2 of FIG. 3a, that is to say that the current flows through the first transistor M1, the inductive load 12 and the third transistor M3.

The method for discriminating the short circuit will in this case be in accordance with the method of an aspect of the present invention that is identical to case 4 presented above.

Case 21 corresponds to a low state of the DIR signal and to a low state of the initial PWM signal. Thus, when DIR=0 and PWM=0, the first transistor M1 and the fourth transistor M4 are in the on state, and the second transistor M2 and the third transistor M3 are in the off state. Case 21 corresponds to the state of the H-bridge 2 of FIG. 3d, that is to say a high-side freewheeling state. Thus, in case 21, a current flows through the first transistor M1, the inductive load 12 and the fourth transistor M4.

Advantageously, in case 21 and upon the circuit break on the basis of the fourth transistor M4, the only possible short circuit is a ground short circuit at the second control output 10. Advantageously, according to the method of an aspect of the present invention, it is not necessary to have an additional test step in case 20, that is to say upon detection of a short circuit during the high-side freewheeling phase.

Case 22 corresponds to a low state of the DIR signal and to a high state of the initial PWM signal. Thus, when DIR=0 and PWM=1, the second transistor M2 and the fourth transistor M4 are in the on state, and the first transistor M1 and the third transistor M3 are in the off state. Case 22 corresponds to the state of the H-bridge 2 of FIG. 3b. In this case, the current flows through the fourth transistor M4, the inductive load 12 and the second transistor M2.

The strategy for locating the short circuit will in this case be identical to the strategy of case 6 presented above.

Case 23 corresponds to a high state of the DIR signal and to a low state of the initial PWM signal. Thus, when DIR=1 and PWM=0, the first transistor M1 and the fourth transistor M4 are in the on state, and the second transistor M2 and the third transistor M3 are in the off state. Case 23 corresponds to the state of the H-bridge 2 of FIG. 3d, that is to say high-side freewheeling. In this case, the current flows through the first transistor M1, the inductive load 12 and the fourth transistor M4. In case 23, according to table 2, we start from the scenario that the circuit break is triggered on the basis of the fourth transistor M4. Locating the short circuit will in this case be identical to the steps of the method that are presented in case 21.

Case 26 corresponds to a low state of the DIR signal and to a high state of the initial PWM signal. Thus, when DIR=0 and PWM=1, the fourth transistor M4 and the second transistor M2 are in the on state, and the first transistor M1 and the third transistor M3 are in the off state.

Case 26 corresponds to the state of the H-bridge 2 of FIG. 3b, that is to say that a current flows through the circuit formed by the fourth transistor M4, the inductive load 12 and the second transistor M2. The steps of the short-circuit detection method are in this case identical to those of case 10 presented above.

Case 32 corresponds to a high state of the DIR signal and to a high state of the initial PWM signal. Thus, when DIR=1 and PWM=1, the first transistor M1 and the third transistor M3 are closed, that is to say in the on state, and the second transistor M2 and the fourth transistor M4 are open, that is to say in the off state.

Case 32 corresponds to the state of the H-bridge 2 of FIG. 3a, that is to say that a current flows through the circuit formed by the first transistor M1, the inductive load 12 and the third transistor M3. The steps of the short-circuit detection method are in this case identical to those of case 16 presented above.

An aspect of the present invention proposes a method for detecting an anomaly in an H-bridge control circuit without a step of channeling the current flowing in the H-bridge in the reverse direction following detection of a short circuit. Advantageously, the method of an aspect of the present invention will be implemented in motor vehicle computers, or else in engine control computers. Advantageously, the method of an aspect of the present invention makes it possible to identify the origin of the short circuit in the structure of the H-bridge, but also in the load controlled by said H-bridge. Furthermore, the method of an aspect of the present invention has a significantly faster execution time than that in the prior art. Advantageously, the method of an aspect of the present invention as presented above does not cause the inductive load to drift when the tests are performed.

Of course, aspects of the present invention are not limited to the preferred embodiment described above and illustrated in the drawing and to the variant embodiments mentioned, but extends to all variants within the scope of those skilled in the art.

The invention claimed is:

1. A method for supplying power to an inductive load comprising:
    an H-bridge switching structure coupled to a positive power supply and to an electrical ground and including a first, a second, a third and a fourth switch that are distributed over two branches of the H-bridge, said four switches being positioned with respect to said inductive load such that closing a first pair of switches formed by the first and third switches allows a current to flow through the inductive load in a forward direction, and that closing a second pair of switches, comprising the second and fourth switches, allows a current to flow through the inductive load in a reverse direction, current measurement means designed to measure a current through each switch, the power supply method comprising:
 a) supplying power to the inductive load for a first given duration by way of the first pair of switches or of the second pair of switches,
 b) reducing an accumulated current in the inductive load after the step of supplying power to the inductive load, for a second given duration, by closing a third pair of switches formed by the second and third switches, or by closing a fourth pair of switches, formed by the first and fourth switches, the method further comprising upon detection of an anomaly by way of the current measurement means during step a) or step b):
 c) identifying the switch out of the four switches that caused the circuit break,
 d) identifying whether the anomaly was detected during step a) or step b),
 if the anomaly is detected in step a):
 h) performing step b) with another pair of switches for a third duration,
 i) identifying the origin of the anomaly,
 if the anomaly is detected in step b):
 j) identifying the origin of the anomaly.

2. The method for supplying power to an inductive load as claimed in claim 1, furthermore comprising, following step f)
 k) detecting the presence of a circuit break on the basis of one of the two activated switches.

3. The method for supplying power to an inductive load as claimed in claim 2, furthermore comprising if a circuit break has not been established:
 i) identifying the origin of the anomaly in the inductive load.

4. The method for supplying power to an inductive load as claimed in claim 2, furthermore comprising if a circuit break has been established:
 j) identifying the origin of the anomaly in the branch of the switch that caused the circuit break.

5. The method for supplying power to an inductive load as claimed in claim 1, furthermore comprising, following step g)
 k) detecting the presence of a circuit break on the basis of the same switch.

6. The method for supplying power to an inductive load as claimed in claim 5, furthermore comprising, following step k)
 l) identifying the origin of the anomaly in the branch of the switch that caused the circuit break.

7. The method for supplying power to an inductive load as claimed in claim 5, furthermore comprising, following step k)
 k) identifying a measurement error if a circuit break has not been established.

8. The method for supplying power to an inductive load as claimed in claim 1, wherein the first duration has a time equal to the second duration.

9. The method for supplying power to an inductive load as claimed in claim 1, wherein the first duration has a time different from the second duration.

10. The method for supplying power to an inductive load as claimed in claim 1, wherein the third duration has a time different from the time of the second duration.

* * * * *